US012790692B2

(12) United States Patent
Jang et al.

(10) Patent No.: US 12,790,692 B2
(45) Date of Patent: Nov. 10, 2026

(54) DEPOSITION APPARATUS

(71) Applicant: Samsung Display Co., LTD., Yongin-si (KR)

(72) Inventors: Choelmin Jang, Seoul (KR); Junggon Kim, Hwaseong-si (KR); Myungsoo Huh, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 874 days.

(21) Appl. No.: 18/296,499

(22) Filed: Apr. 6, 2023

(65) Prior Publication Data

US 2024/0011156 A1 Jan. 11, 2024

(30) Foreign Application Priority Data

Jul. 8, 2022 (KR) ........................ 10-2022-0084112

(51) Int. Cl.

| | |
|---|---|
| ***C23C 16/455*** | (2006.01) |
| ***C23C 16/44*** | (2006.01) |
| ***C23C 16/458*** | (2006.01) |
| ***C23C 16/52*** | (2006.01) |

(52) U.S. Cl.

CPC .... *C23C 16/45561* (2013.01); *C23C 16/4412* (2013.01); *C23C 16/45544* (2013.01); *C23C 16/4583* (2013.01); *C23C 16/52* (2013.01)

(58) Field of Classification Search

CPC .......... C23C 16/45561; C23C 16/4412; C23C 16/45544; C23C 16/4583; C23C 16/52; C23C 16/45548; C23C 16/04; C23C 16/45557

See application file for complete search history.

(56) References Cited

U.S. PATENT DOCUMENTS 6,663,714 B2 * 12/2003 Mizuno ............. C23C 16/45508 118/728
8,092,606 B2 1/2012 Park et al.
10,643,839 B2 * 5/2020 Suzuki ................ H10P 14/6339
2007/0022959 A1 * 2/2007 Bercaw ............... C23C 16/4401 118/728
2010/0279008 A1 * 11/2010 Takagi .................. C23C 16/409 118/725
2016/0258060 A1 * 9/2016 Huh ................... H10K 59/8731
2019/0211445 A1 * 7/2019 Ko ...................... C23C 16/4405
(Continued)

FOREIGN PATENT DOCUMENTS

JP 2009149989 A * 7/2009 ......... C23C 16/4408
JP 4786818 10/2011
JP 5210853 B2 * 6/2013 ....... C23C 16/45563
(Continued)

*Primary Examiner* — Jeffrie R Lund

(74) *Attorney, Agent, or Firm* — Womble Bond Dickinson (US) LLP

(57) ABSTRACT

A deposition apparatus includes a gas supply including a plurality of gas injection ports, a plate disposed to face the gas supply and to move up and down toward the gas supply, wherein a target substrate is seated on the plate, a body part includes a first portion defining a reaction space between the plate and the gas supply, a second portion disposed below the first portion and defining a lower space, an inner wall spaced apart from the plate, and a plurality of first exhaust parts provided on an outer wall of the first portion.

19 Claims, 9 Drawing Sheets

(56) References Cited

U.S. PATENT DOCUMENTS

2024/0011156 A1* 1/2024 Jang .................... C23C 16/4583

FOREIGN PATENT DOCUMENTS

| | | | | | |
|---|---|---|---|---|---|
| JP | 2017017285 | A | * | 1/2017 | ............. C23C 16/46 |
| KR | 20040048618 | A | * | 6/2004 | |
| KR | 10-1028410 | | | 4/2011 | |
| KR | 20110058393 | A | * | 6/2011 | ............. C23C 16/18 |
| KR | 101078185 | B1 | * | 11/2011 | ........ H01J 37/32633 |
| KR | 101481540 | B1 | * | 1/2015 | .......... H10P 72/0468 |
| KR | 10-1493250 | | | 2/2015 | |
| KR | 10-2017-0006214 | | | 1/2017 | |
| KR | 20220049261 | A | * | 4/2022 | ............. C23C 16/54 |
| KR | 20250136991 | A | * | 9/2025 | .......... H10P 72/7621 |
| TW | 200952109 | A | * | 12/2009 | ....... C23C 16/45531 |
| TW | I320088 | B | * | 2/2010 | .......... H10P 72/3306 |
| WO | WO-2013115471 | A1 | * | 2/2010 | .......... H10P 72/3306 |

* cited by examiner

DEPOSITION APPARATUS

CROSS-REFERENCE TO RELATED APPLICATION(S)

This application claims priority to and benefits of Korean Patent Application No. 10-2022-0084112 under 35 U.S.C. § 119, filed on Jul. 8, 2022 in the Korean Intellectual Property Office (KIPO), the entire contents of which are incorporated herein by reference.

BACKGROUND

1. Technical Field

Embodiments relate generally to a deposition apparatus.

2. Description of the Related Art

A display device manufacturing process may include a thin film forming process. The thin film may be formed through a deposition process using an atomic layer deposition apparatus. A reaction gas and a purge gas may be sequentially injected into the atomic layer deposition apparatus, and a thin film formed on a substrate to be deposited through a surface reaction between the reaction gas and the purge gas. The thin film formed using the atomic layer deposition apparatus has excellent applicability and uniformity.

However, as the size of the substrate to be deposited increases, the size of the atomic layer deposition apparatus needs to be increased. Accordingly, the time for supplying and discharging the reaction gas and the purge gas may increase, thereby reducing process efficiency.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a deposition apparatus.

A deposition apparatus according to an embodiment may include a gas supply comprising a plurality of gas injection ports, a plate disposed to face the gas supply and to move up and down toward the gas supply, wherein a target substrate may be seated on the plate, a body part may include a first portion defining a reaction space between the plate and the gas supply, a second portion disposed below the first portion and defining a lower space, and an inner wall spaced apart from the plate, and a plurality of first exhaust parts provided on an outer wall of the first portion.

In an embodiment, the plate may have an N-gonal shape that is point symmetric with respect to a center of the first portion in a plan view, and the plurality of first exhaust parts may be disposed at positions corresponding to N vertices of the plate.

In an embodiment, a deposition apparatus may further include a third portion protruding from the outer wall of the first portion, each of the plurality of first exhaust parts may be connected to the third portion, and a diameter of an inner wall of the third portion has a smaller diameter in a direction from the first portion toward each of the plurality of first exhaust parts.

In an embodiment, a deposition apparatus may further include a shadow frame disposed on the plate.

In an embodiment, the shadow frame may include a fixing part defining an opening exposing the target substrate, and a wall part extending downward along the inner wall of the body part from a lower surface of the fixing part.

In an embodiment, the fixing part may have an N-gonal shape that is point symmetric with respect to the center of the first portion in a plan view, N being a natural number equal to or greater than 3.

In an embodiment, the wall part may be disposed along an outer boundary of the body part in the plan view.

In an embodiment, a deposition apparatus may further include a third portion protruding from the outer wall of the first portion, each of the plurality of first exhaust parts may be connected to the third portion, a diameter of an inner wall of the third portion may gradually decrease in a direction from the first portion toward each of the plurality of first exhaust parts, and a length from a lower surface of the wall part to an upper surface of the fixing part may be formed to be longer than a diameter in an elevating direction of the plate. The diameter of the plate in the elevating direction may be defined as the diameter of the third portion at a position where the third portion physically contacts the first portion.

In an embodiment, a distance between an inner wall of the second portion and the shadow frame may be constant.

In an embodiment, the distance between the inner wall of the second portion and the shadow frame may be about 0.5 mm or more and about 5 mm or less.

In an embodiment, an inner wall of the first portion may be defined a plurality of flow paths through which a gas supplied from the gas supply to the reaction space flows to the plurality of first exhaust parts, and the plurality of flow paths may gradually decrease in width in a direction from a center of the first portion toward the plurality of first exhaust parts.

In an embodiment, the inner wall of the first portion may include a first inner wall and a second inner wall defining any one of the plurality of flow paths, and an angle between the first inner wall and the second inner wall may be greater than about 45 degrees and less than about 90 degrees.

In an embodiment, a portion of gas supplied from the gas supply to the reaction space flows into the lower space through a space between the inner wall of the body part and the plate.

In an embodiment, an amount of the gas supplied from the gas supply unit to the reaction space and discharged to the plurality of first exhaust parts may be greater than an amount of the portion of the gas flowing into the lower space through a space between the inner wall of the body part and the plate.

The body part may be capable of performing an Atomic Layer Deposition (ALD) process.

The deposition apparatus may include a second exhaust part provided on a bottom surface of the second portion.

A deposition apparatus may include a gas supply that may include a plurality of gas injection ports, a plate disposed to face the gas supply and to move up and down toward the gas supply, wherein a target substrate is seated on the plate, a body part comprising a first portion defining a reaction space between the plate and the gas supply, a second portion disposed below the first portion and defining a lower space, and an inner wall spaced apart from the plate, a pumping line connected to an outer wall of the first portion, and a pump connected to the pumping line.

In an embodiment, a deposition apparatus may further include a pressure gauge, a throttle valve, and a controller. The pressure gauge may be connected to the outer wall of the first part, and the throttle valve may be connected between the pressure gauge and the pumping line, and the controller may monitor the pressure inside the body using the pressure gauge, and may control movement of the throttle valve.

In an embodiment, a deposition apparatus may further include a third portion protruding from the outer wall of the first portion, and the pumping line may be connected to the third portion.

In an embodiment, an inner wall of the third portion may be formed to gradually decrease in width from the first portion toward the pumping line.

According to embodiments, a deposition apparatus may include a gas supply comprising a plurality of gas injection ports, a plate disposed to face the gas supply and to move up and down toward the gas supply, wherein a target substrate may be seated on the plate, a body part may include a first portion defining a reaction space between the plate and the gas supply, a second portion disposed below the first portion and defining a lower space, and the body part having an inner wall spaced apart from the plate, and a plurality of first exhaust parts provided on an outer wall of the first portion. Accordingly, the deposition apparatus may quickly exhaust gases in the body part and may minimize the deposition process time.

BRIEF DESCRIPTION OF THE DRAWINGS

Illustrative, non-limiting embodiments will be more clearly understood from the following detailed description in conjunction with the accompanying drawings, in which.

DETAILED DESCRIPTION OF THE EMBODIMENTS

Figure 1A:
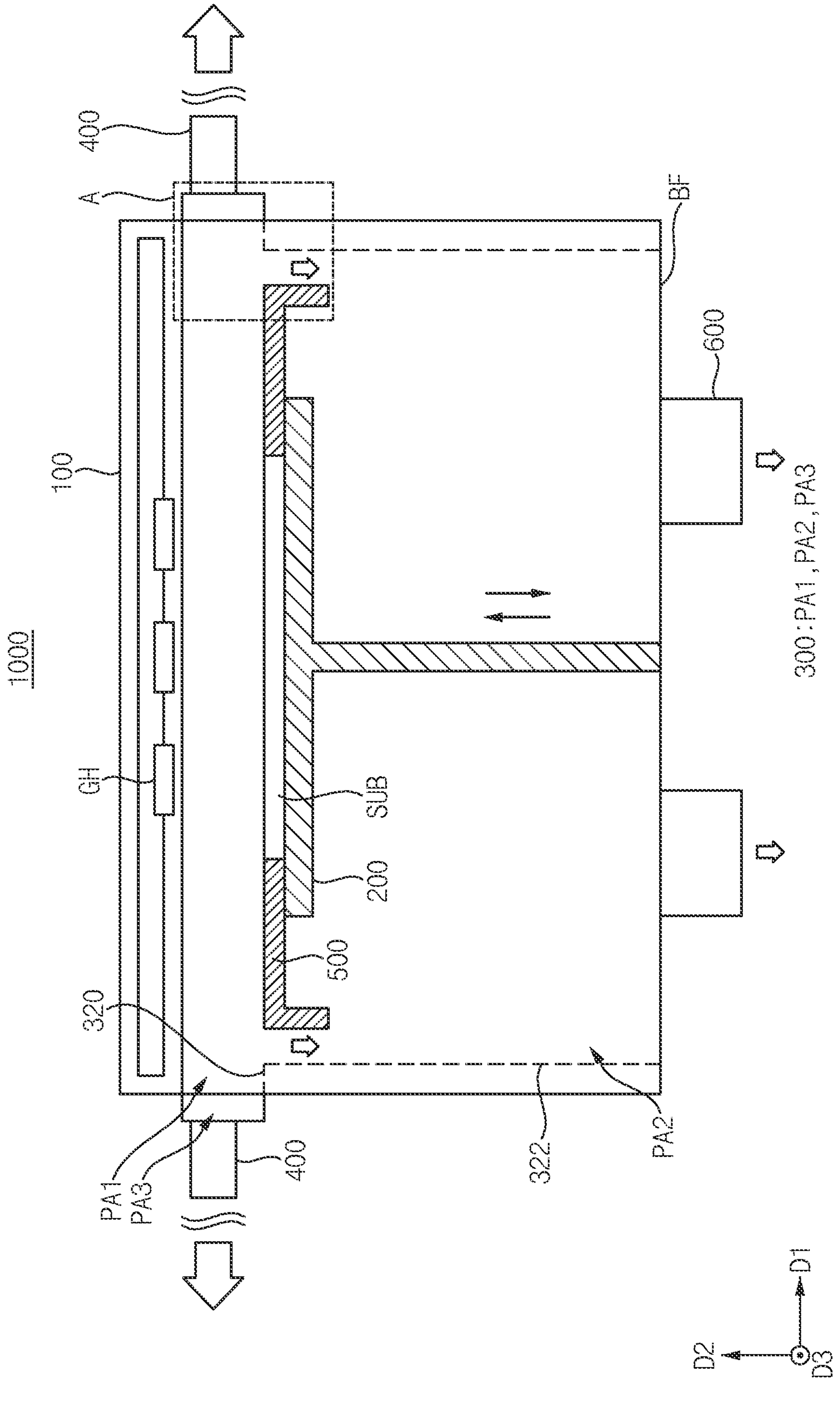
FIG. 1A and FIG. 1B are schematic views illustrating a deposition apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, “a,” “an,” and “the” are intended to include the plural forms as well, unless the context clearly indicates otherwise.

In the specification and the claims, the term “and/or” is intended to include any combination of the terms “and” and “or” for the purpose of its meaning and interpretation. For example, “A and/or B” may be understood to mean any combination including “A, B, or A and B.” The terms “and” and “or” may be used in the conjunctive or disjunctive sense and may be understood to be equivalent to “and/or.”

In the specification and the claims, the phrase “at least one of” is intended to include the meaning of “at least one selected from the group of” for the purpose of its meaning and interpretation. For example, “at least one of A and B” may be understood to mean any combination including “A, B, or A and B.”

It will be understood that the terms “connected to” or “coupled to” may include a fluidic, physical, and/or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

“About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value.

Figure 1B:
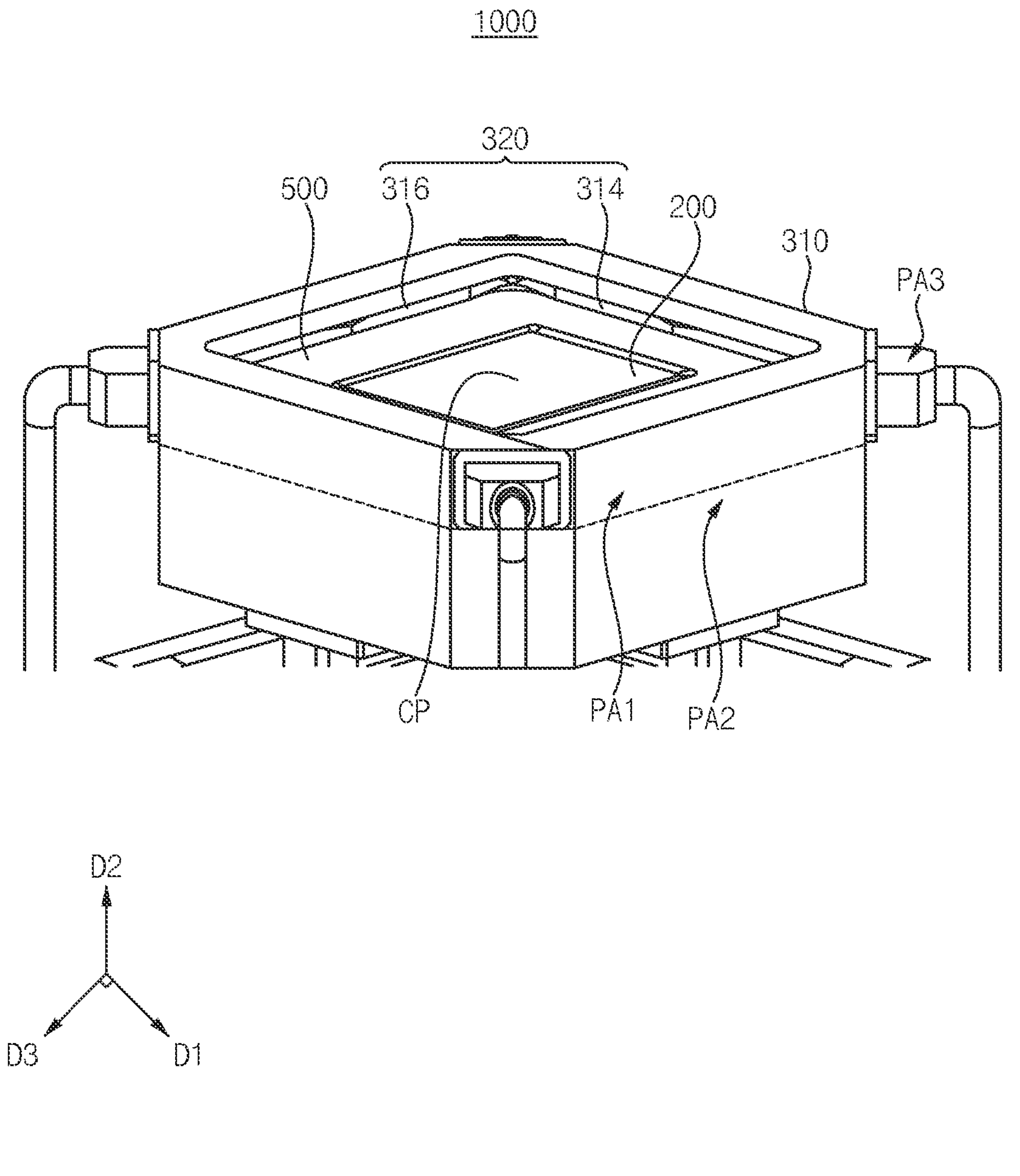

FIG. 1A and FIG. 1B are views illustrating a deposition apparatus according to an embodiment. FIG. 1A is a cross-sectional view of the deposition apparatus according to an embodiment, and FIG. 1B is a perspective view of the deposition apparatus according to an embodiment.

Referring to FIG. 1, the deposition apparatus 1000 according to an embodiment may include a gas supply unit (gas supply) 100, a plate 200, a body part 300, and multiple first exhaust parts 400.

The gas supply unit 100 may provide a source gas, a reaction gas, and a purge gas. To this end, the gas supply unit 100 may include multiple gas injection ports GH for selectively or simultaneously injecting the source gas, the reaction gas, and the purge gas.

The source gas may be used to deposit a thin film. In an embodiment, the source gas may include at least one of aluminum and silicon. In case that the source gas includes aluminum, the source gas may be TMA. In case that the source gas includes silicon, the source gas may be an organometallic source gas. For example, the source gas may be DIPAS, BTBAS, BDEAS, and/or 3DMAS.

The reaction gas may be a gas capable of oxidizing or nitriding the source gas deposited on a target substrate SUB. For example, the reaction gas may be at least one of nitrogen ($N2$), oxygen ($O2$), nitrous oxide ($N2O$), ammonia ($NH3$), and ozone ($O3$).

The purge gas may be a gas that does not chemically react with the source gas, the reaction gas, and the thin film.

The plate 200 may be disposed to face the gas supply unit 100. For example, the plate 200 may be disposed on a plane formed along a first direction D1 and a third direction D3 perpendicular to the first direction D1.

The plate 200 may have an N-gonal shape that is point-symmetric with respect to a center CP of a first portion PA1 in a plan view. The plate 200 may support (or accommodate) the target substrate SUB. To this end, the plate 200 may have a flat plate shape having an area larger than that of the target substrate SUB.

The plate 200 may move up and down toward the gas supply unit 100. For example, the plate 200 may move up and down along a second direction D2. The plate 200 may be fixed without moving during the deposition process.

The body part 300 may include the first portion PA1, a second portion PA2, and a third portion PA3.

The first portion PA1 may define a reaction space between the gas supply unit 100 and the plate 200. More specifically, after the target substrate SUB is seated on the plate 200, the plate 200 may move up and down toward the gas supply unit 100. The plate 200 may move only in a direction of narrowing the distance in the second direction D2 between the gas supply unit 100 and the plate 200. A space surrounded by the plate 200, the gas supply unit 100, and the first portion PA1 may be defined as the reaction space.

The second portion PA2 may be disposed below the first portion PA1. For example, the first portion PA1 may be positioned on an upper portion of the body part 300, and the second portion PA2 may be positioned on a lower portion of the body part 300.

The third portion PA3 may be formed to protrude from an outer wall 310 of the first portion PA1. For example, in case that the body part 300 has a rectangular shape, the third portion PA3 may be respectively disposed at positions corresponding to four vertices of the body part 300.

The first exhaust parts 400 may be provided on the outer wall 310 of the first portion PA1. In detail, each of the first exhaust parts 400 may be connected to the third portion PA3 protruding from the outer wall 310 of the first portion PA1.

The first exhaust parts 400 may be disposed at positions corresponding to N vertices of the plate 200. For example, in case that the plate 200 has the rectangular shape, the first exhaust parts 400 may be respectively disposed at positions corresponding to four vertices of the plate 200. Although not shown, the first exhaust parts 400 may be disposed to be symmetrical with respect to the center CP of the first portion PA1 even if they are not at each vertex of the quadrangle. Accordingly, gas supply and exhaust may be rapidly performed without generating a vortex.

The deposition apparatus 1000 may further include a shadow frame 500.

The shadow frame 500 may be disposed on the plate 200. The shadow frame 500 may be disposed to have a constant distance (for example, a distance IN of FIG. 4) from an inner wall 322 of the second portion PA2. A detailed description of the shadow frame 500 will be described later with reference to FIGS. 2 to 6.

The deposition apparatus 1000 may further include a second exhaust part 600.

The second exhaust part 600 may be provided on a bottom surface BF of the second portion PA2.

Most of the gas supplied from the gas supply unit 100 may be exhausted through the first exhaust parts 400. Residual gas that is not exhausted through the first exhaust parts 400 may flow into a gap between the shadow frame 500 and the inner wall 322 of the second portion PA2, and may exhaust into the second exhaust part 600.

Figure 2:
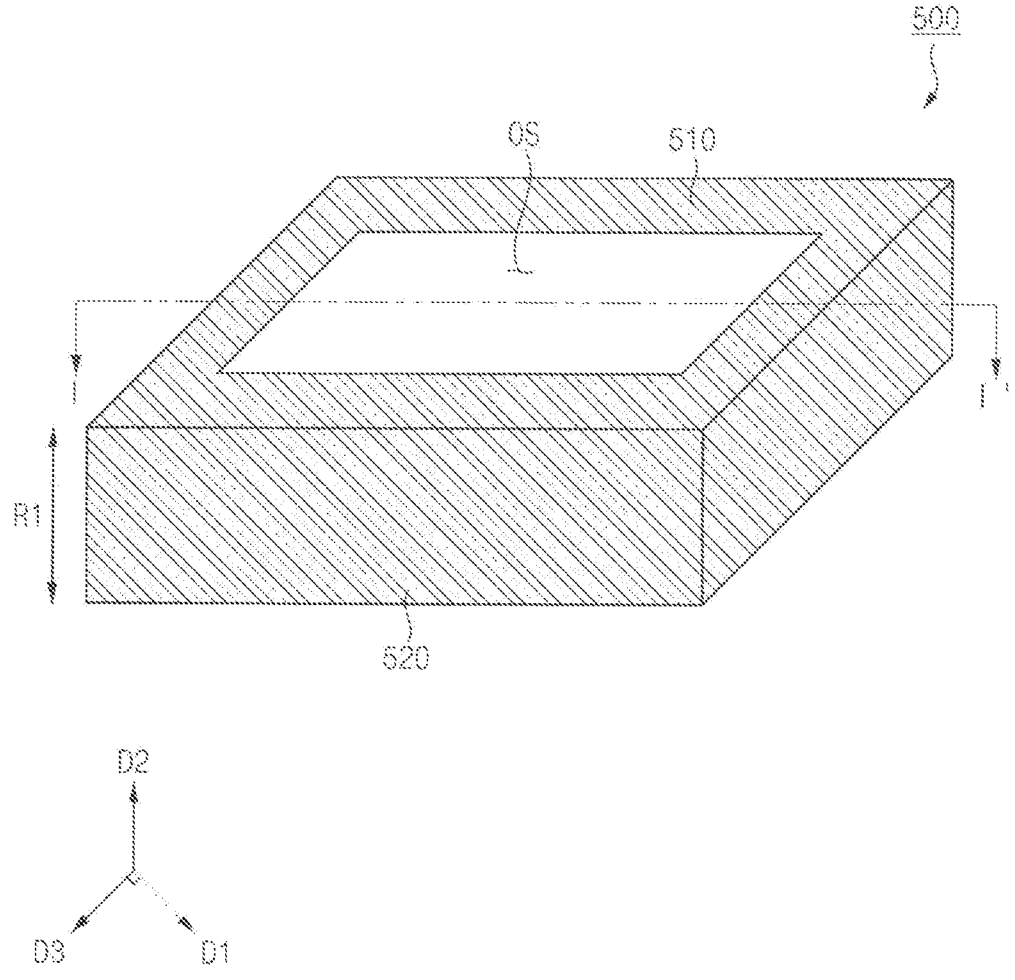
FIG. 2 is a schematic perspective view of a shadow frame in the deposition apparatus of FIG. 1A.
Figure 3:
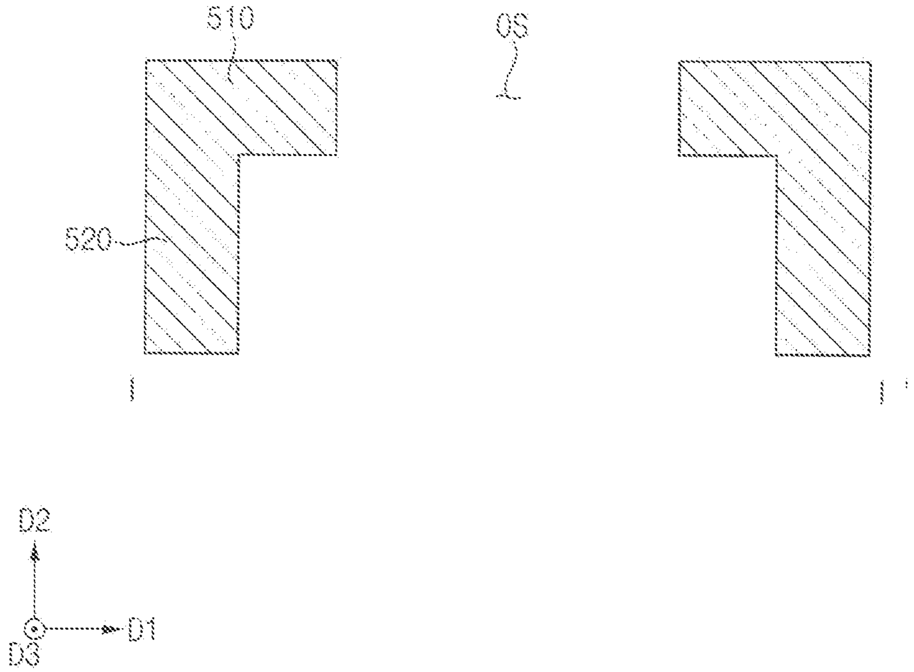
FIG. 3 is a schematic cross-sectional view taken along line I-I' of FIG. 2.

FIG. 2 is a schematic perspective view of the shadow frame in the deposition apparatus of FIG. 1A, and FIG. 3 is a schematic cross-sectional view taken along line I-I' of FIG. 2.

Referring to FIG. 2, the shadow frame 500 may include a fixing part 510 and a wall part 520.

The fixing part 510 may define an opening OS exposing the target substrate SUB.

The fixing part 510 may be point symmetric with respect to the center CP of the first portion PA1 in a plan view and may have an N-gonal shape. Here, N may be a natural number of 3 or more.

Referring to FIG. 3, the wall part 520 may extend downward along an inner wall of the body part 300 from a lower surface of the fixing part 510. The wall part 520 may be disposed along an outer boundary of the body part 300 in plan view. Each of the four surfaces included in the wall part 520 may have a rectangular shape. Accordingly, the shadow frame 500 may control the amount of exhaust gas flowing into a lower space. A detailed description thereof will be described later with reference to FIG. 4.

Figure 4:
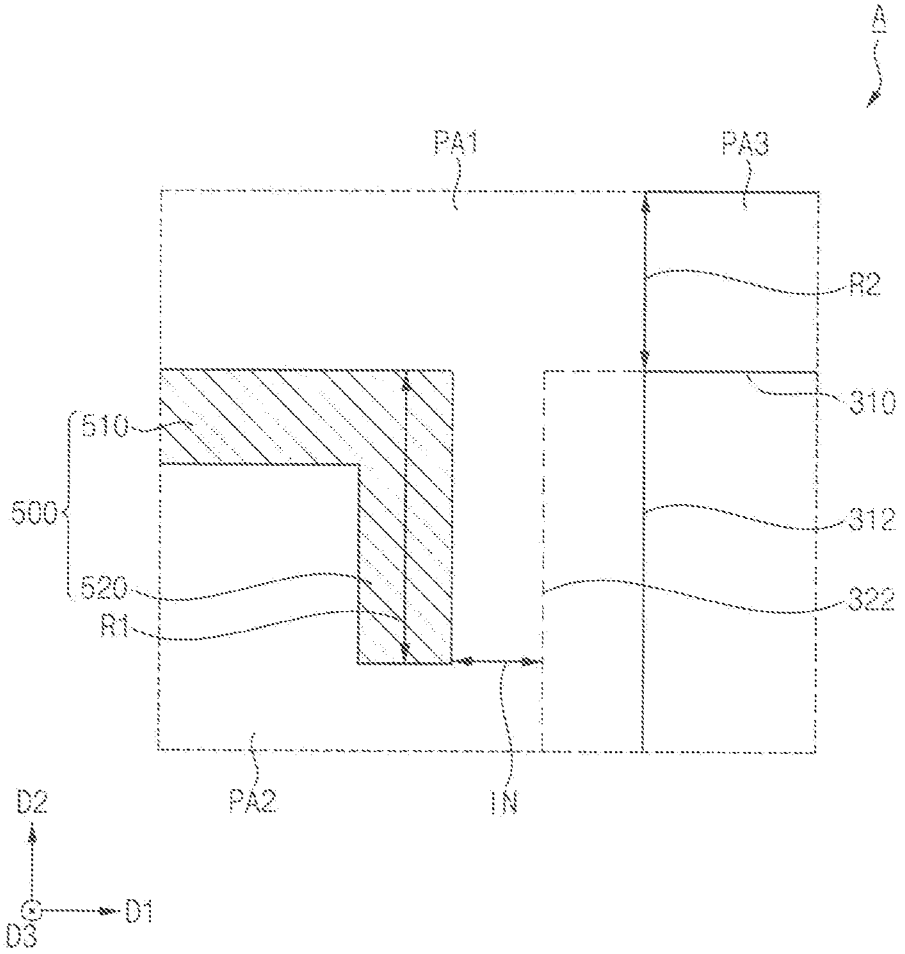
FIG. 4 is a schematic plan view of enlarged portion A of FIG. 1A.

FIG. 4 is a schematic plan view of enlarged portion A of FIG. 1A.

Referring to FIG. 4, the level of an upper surface of the fixing part 510 may be substantially the same as the level of an upper surface of the inner wall 322 of the second portion PA2. In other embodiments, the level of the upper surface of the fixing part 510 may be substantially higher than the level of the upper surface of the inner wall 322 of the second portion PA2. In other words, during the deposition process, the level of the upper surface of the fixing part 510 may be equal to or higher than the level of the upper surface of the inner wall 322 of the second portion PA2.

The wall part 520 may have a relatively large length. For example, a length (hereinafter, referred to as "first length R1") from a lower surface of the wall part 520 to the upper surface of the fixing part 510 is formed longer than a diameter (hereinafter, referred to as "second length R2") in an elevating direction of the plate 200 at a position where the third portion PA3 contacts with the first portion PA1. Accordingly, even in case that the plate 200 rises toward the gas supply unit 100, an amount of exhaust gas flowing through a gap between the plate 200 and the inner wall 322 of the second portion PA2 may be reduced. For example, if the shadow frame 500 according to an embodiment is used rather than the shadow frame 500 having only the fixing part 510 and without the wall part 520, the amount of exhaust gas flowing into the lower space can be reduced.

A distance IN between an inner wall 322 of the second portion PA2 and the shadow frame 500 may be constant. Accordingly, in case that the gas supplied from the gas supply unit 100 moves to the first exhaust parts 400, the flow rate or pressure of the gas supplied from the gas supply unit 100 may be constantly maintained.

For example, the distance IN between the shadow frame 500 and the inner wall 322 of the second portion PA2 may be greater than or equal to about 0.5 mm and less than or equal to about 5 mm.

In case that the distance IN between the shadow frame 500 and the inner wall 322 of the second portion PA2 is less than about 0.5 mm, the problem that the plate 200 may not move up and down may occur. The shadow frame 500 may be thermally expanded during the deposition process. Accordingly, the shadow frame 500 and the wall 322 of the second inner portion PA2 may contact each other.

On the other hand, in case that the distance IN between the shadow frame 500 and the inner wall 322 of the second portion PA2 exceeds about 5 mm, most of the gas supplied from the gas supply unit 100 may flow into the lower space. Residual gas may be accumulated at the corner of the bottom surface BF of the lower space, and contamination may occur in the second portion PA2.

The numerical range may be deformable according to the material and shape of the body part 300. A minimum distance IN may be set to have the distance IN that does not interfere with the up and down movement of the plate 200. A maximum distance IN may be set to be smaller than exhaust conductance of the first exhaust parts 400.

Figure 5:
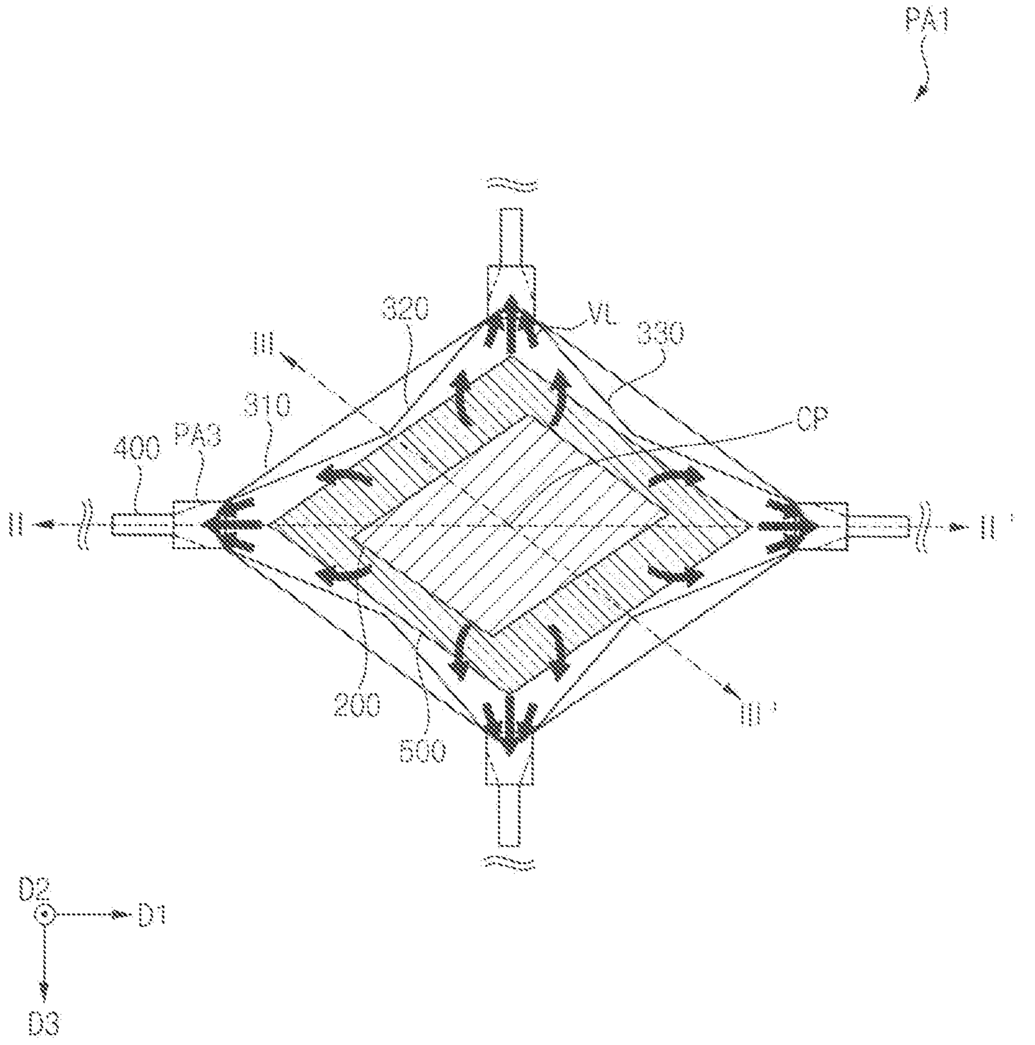
FIGS. 5 and 6 are schematic views illustrating a first portion in the deposition apparatus of FIG. 1A.
Figure 6:
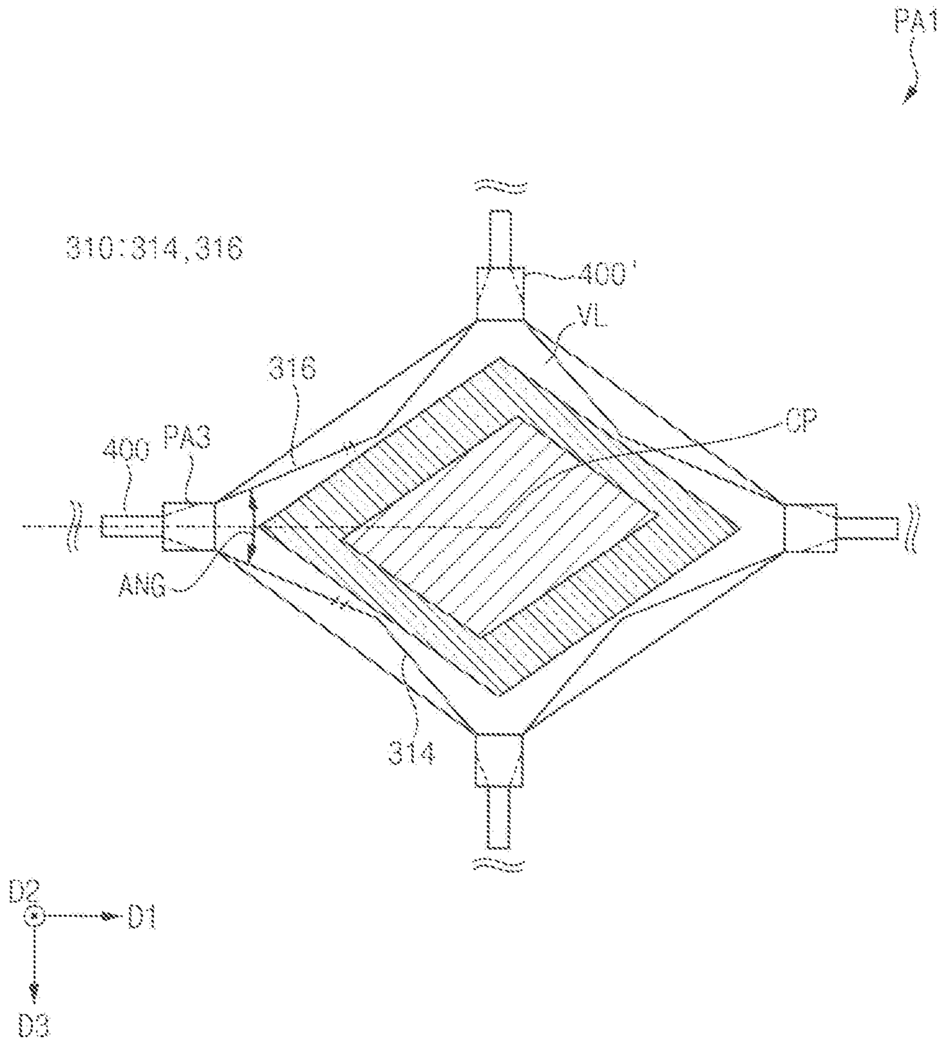

FIGS. 5 and 6 are schematic views illustrating the first portion in the deposition apparatus of FIG. 1A. FIGS. 5 and 6 are plan views of a first portion included in the deposition apparatus of FIG. 1A.

Referring to FIG. 5, an inner wall 320 of the first portion PA1 may define multiple flow paths VL through which the gas supplied from the gas supply unit 100 to the reaction space flows to the first exhaust parts 400.

Each of the flow paths VL may gradually decrease in width in a direction from the center CP of the first portion PA1 toward each of the first exhaust parts 400. For example, the inner wall 320 of the first portion PA1 may gradually decrease in width from the center CP of the first portion PA1 toward an exhaust direction in which the first exhaust parts 400 are disposed.

An inner wall of the third portion PA3 may gradually decrease in width as it goes from the first portion PA1 toward the first exhaust parts 400. For example, a width of each of the flow paths VL may gradually decrease from the center CP of the first portion PA1 toward the first exhaust parts 400.

Referring to FIG. 6, an angle ANG between a first inner wall 314 and a second inner wall 316 of the first portion PA1 defining any one of the passages VL may be greater than about 45 degrees and less than about 90 degrees. In an embodiment, the angle ANG between the first inner wall 314 and the second inner wall 316 may be greater than or equal to about 50 degrees and less than or equal to about 80 degrees.

For example, in case that the body part 300 has a rectangular shape, the angle ANG between the first inner wall 314 and the second inner wall 316 may be greater than about 45 degrees and less than about 90 degrees. In an embodiment, the angle ANG between the first inner wall 314 and the second inner wall 316 may be greater than or equal to about 50 degrees and less than or equal to about 80 degrees. The numerical range about the angle ANG may be deformable according to the shape of the body part 300.

The inner wall 320 of the first part PA1 adjacent to a first exhaust part 400', which may be one of the first exhaust parts 400, may be symmetrical with respect to an imaginary line. The imaginary line may be a line connecting the first exhaust unit 400' and the center CP of the first portion PA1. For example, referring to FIGS. 5 and 6, the first inner wall 314 and the second inner wall 316 may be symmetrical with respect to the imaginary line, which may connect the first exhaust unit 400' and the center CP of the first portion PA1.

A portion of gas supplied from the gas supply unit 100 to the reaction space may flow into the lower space through the inner walls 320 and 322 of the body part 300 and the plate 200. In one embodiment, in case that the shadow frame 500 further disposed on the plate 200, the portion of the gas supplied to the reaction space may flow into the lower space through a gap between the shadow frame 500 and the inner wall 322 having the distance IN.

The amount of gas supplied from the gas supply unit 100 to the reaction space and discharged to the first exhaust units 400 may be greater than the amount of gas that may be supplied to the reaction space to flow into the lower space. The gas supplied to the reaction space may flow into the lower space through between the inner walls 320 and 322 of the body part 300 and the plate 200. In detail, most of the gas supplied to the reaction space may be exhausted through the first exhaust parts 400, and only a relatively small amount of gas may flow through the gap between the shadow frame 500 and the inner wall 322 of the second part PA2.

As described above with reference to FIG. 1A, in order to exhaust the gas flowing into the gap between the shadow frame 500 and the inner wall 322 of the second portion PA2, the second exhaust part 600 may be further disposed in the bottom surface BF of the second portion PA2. Accordingly, contamination of a lower corner of the second portion PA2 may be prevented.

Figure 7:
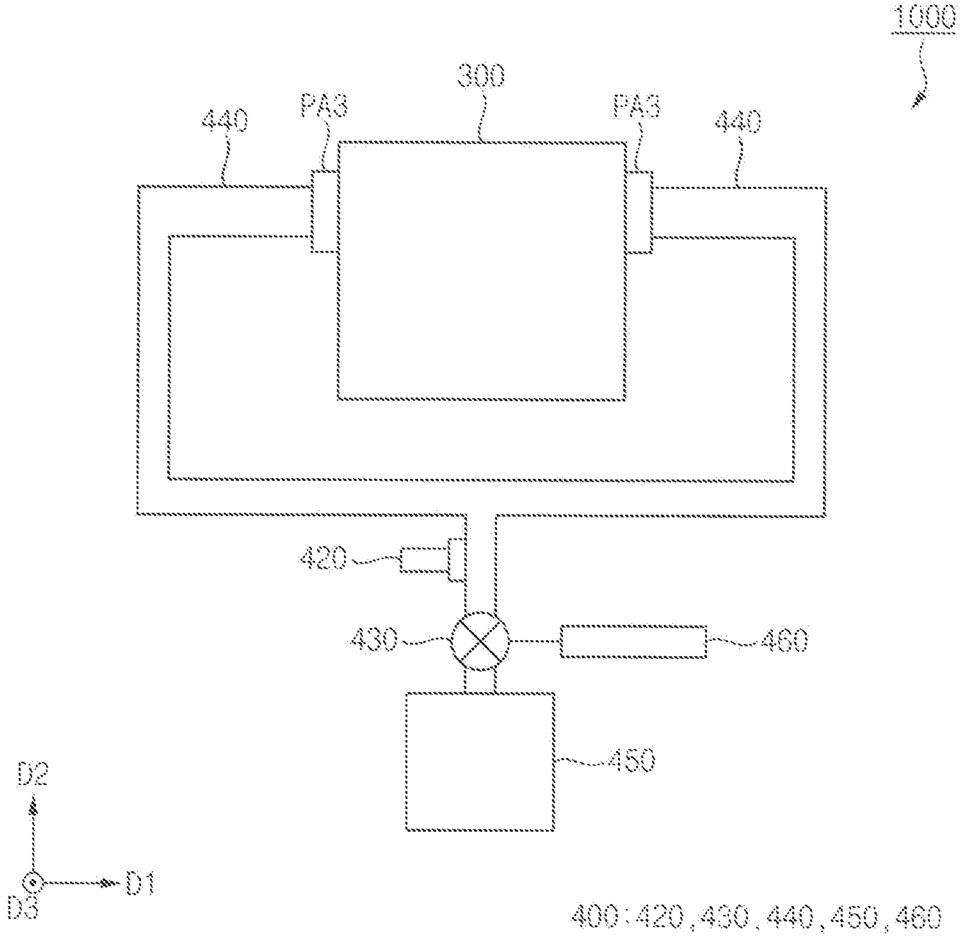
FIG. 7 is a schematic view illustrating a plurality of first exhaust parts in the deposition apparatus of FIG. 1A.

FIG. 7 is a schematic view illustrating the first exhaust parts in the deposition apparatus of FIG. 1A.

Referring to FIG. 7, each of the first exhaust parts 400 may include a pressure gauge 420, a throttle valve 430, a pumping line 440, a pump 450, and a controller 460.

An end of the pumping line 440 may be connected to the outer wall 310 of the first portion PA1 defining the reaction space between the gas supply unit 100 and the plate 200. The pumping line 440 may be disposed at an upper corner of the body part 300. In detail, the pumping line 440 may be disposed on the third portion PA3 protruding from the outer wall 310 of the first portion PA1. As described above with reference to FIG. 6, the inner wall of the third portion PA3 may gradually decrease in width from the first portion PA1 to the pumping line 440. Accordingly, the flow of the exhaust gas may be guided to each of the first exhaust parts 400. Another end of the pumping line 440 may be connected to the pump 450.

The pressure gauge 420 may be connected to the pumping line 440. The pressure gauge 420 may monitor the internal pressure of the body part 300.

The throttle valve 430 may be connected between the pressure gauge 420 and the pump 450. The throttle valve 430 may be used to constantly maintain the internal pressure monitored by the pressure gauge 420.

The pump 450 may be connected to another end of the pumping line 440. The pump 450 connected to each of the first exhaust parts 400 symmetrically arranged may shorten the exhaust path by using an upper pumping method and may prevent the occurrence of the vortex according to a lower shape of the body part 300.

The controller 460 may control the movement of the throttle valve 430 by monitoring internal pressure of the body part 300 using the pressure gauge 420. For example, by tightening or loosening the throttle valve 430, internal pressure of the body part 300 may be constantly maintained. Accordingly, the gas supplied from the gas supply unit 100 to the reaction space may be uniformly exhausted through each of the first exhaust parts 400.

Figure 8:
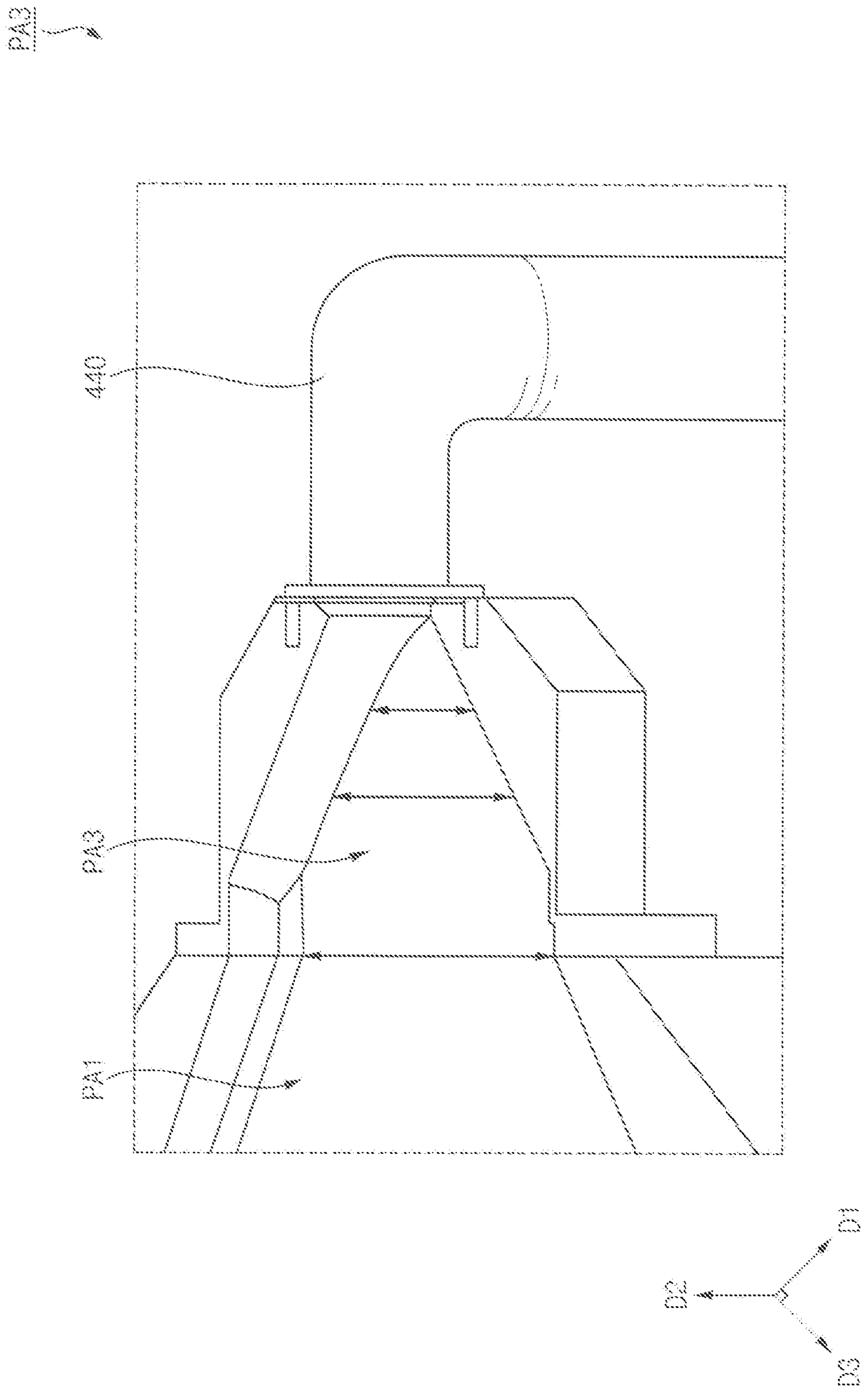
FIG. 8 is a schematic view illustrating a third portion in the deposition apparatus of FIG. 1A.

FIG. 8 is a schematic view illustrating the third portion in the deposition apparatus of FIG. 1A.

Referring to FIG. 8, the inner wall of the third portion PA3 may gradually decrease in width as it goes from the first portion PA1 toward the pumping line 440.

The width of each of the flow paths VL defined by the inner wall 320 of the first portion PA1 may gradually decrease in the direction from the center CP of the first portion PA1 to the third portion PA3. The width of the inner wall of the third portion PA3 may gradually decrease as it goes toward the exhaust direction connected from the first portion PA1 to the pumping line 440. For example, the width of each of the flow paths VL may gradually decrease from the center CP of the first portion PA1 toward the pumping line 440.

For CVD plants, fast gas switching may not be required. Therefore, there may be no problem in using a deposition apparatus using a bottom pumping method.

However, in the case of ALD plants, fast gas switching may be required. Specifically, in an ALD process, a cycle may be configured in the following order. First, the reaction source may be supplied, the purge gas may be supplied, the reaction gas may be supplied, and the purge gas may be supplied. Here, the reaction source and the reaction gas may be sequentially injected to form a thin film through a surface reaction.

As a result of flow analysis using the deposition apparatus 1000 according to an embodiment, gas flow may hardly be seen in the lower part of the body part 300 after about 0.1 seconds after gas supply from the gas supply unit 100. The gas flow may hardly be seen in the lower part of the body part 300 even after about 10 seconds pass after the gas supply from the gas supply unit 100.

Gas may be supplied from the gas supply unit 100 to the reaction space, and after about 0.1 seconds, most of the gas may be discharged to the first exhaust parts 400. Therefore, it may be possible to quickly switch to the purge gas after supplying the reaction source.

After the gas may be supplied from the gas supply unit 100 to the reaction space, the gas flow may be hardly seen in the second portion PA2 after about 10 seconds.

The deposition apparatus 1000 may use the upper pumping method in which the first exhaust parts 400 disposed in the first portion PA1 may be pumped. The gas supplied from the gas supply unit 100 may be exhausted along the flow paths VL. For example, the gas supplied from the gas supply unit 100 may be exhausted from the upper portion of the body part 300. Accordingly, the exhaust path may be shortened, and the gas may be switched quickly by preventing the occurrence of the vortex.

The deposition apparatus 1000 may further include the second exhaust part 600 on the bottom surface BF of the second portion PA2 in order to exhaust the gas stagnated on the bottom surface BF. Accordingly, it may be possible to prevent the exhaust gas from stagnating on the bottom surface BF of the second portion PA2. For example, particles may not be generated on the bottom surface BF of the deposition apparatus 100.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the disclosure. Accordingly, all such modifications are intended to be included within the scope of the disclosure. Therefore, it is to be understood that the foregoing is illustrative of various embodiments and is not to be construed as limited to the specific embodiments disclosed, and that modifications to the disclosed embodiments, as well as other embodiments, are intended to be included within the scope of the disclosure.

What is claimed is:

1. A deposition apparatus comprising:

a gas supply comprising a plurality of gas injection ports;

a plate disposed to face the gas supply and to move up and down toward the gas supply, wherein a target substrate is seated on the plate;

a body part comprising:

a first portion defining a reaction space between the plate and the gas supply;

a second portion disposed below the first portion and defining a lower space; and an inner wall spaced apart from the plate, and a plurality of first exhaust parts provided on an outer wall of the first portion, wherein the plate has an N-gonal shape that is point symmetric with respect to a center of the first portion in a plan view, and the plurality of first exhaust parts are disposed at positions corresponding to N vertices of the plate.

2. The deposition apparatus of claim 1, further comprising:

a third portion protruding from the outer wall of the first portion, wherein each of the plurality of first exhaust parts is connected to the third portion, and a diameter of an inner wall of the third portion has a smaller diameter in a direction from the first portion toward each of the plurality of first exhaust parts.

3. The deposition apparatus of claim 1, further comprising:

a shadow frame disposed on the plate.

4. The deposition apparatus of claim 3, wherein the shadow frame comprises:

a fixing part defining an opening exposing the target substrate; and a wall part extending downward along the inner wall of the body part from a lower surface of the fixing part.

5. The deposition apparatus of claim 4, wherein the fixing part has an N-gonal shape that is point symmetric with respect to the center of the first portion in a plan view, N being a natural number equal to or greater than 3.

6. The deposition apparatus of claim 5, wherein the wall part is disposed along an outer boundary of the body part in the plan view.

7. The deposition apparatus of claim 5, further comprising:

a third portion protruding from the outer wall of the first portion, wherein each of the plurality of first exhaust parts is connected to the third portion, and a diameter of an inner wall of the third portion gradually decreases in a direction from the first portion toward each of the plurality of first exhaust parts, and a length from a lower surface of the wall part to an upper surface of the fixing part is formed longer than a diameter in an elevating direction of the plate at a position where the third portion physically contacts the first portion.

8. The deposition apparatus of claim 3, wherein a distance between an inner wall of the second portion and the shadow frame is constant.

9. The deposition apparatus of claim 8, wherein the distance between the inner wall of the second portion and the shadow frame is about 0.5 mm or more and about 5 mm or less.

10. The deposition apparatus of claim 1, wherein an inner wall of the first portion defines a plurality of flow paths through which a gas supplied from the gas supply to the reaction space flows to the plurality of first exhaust parts, and the plurality of flow paths gradually decrease in width in a direction from a center of the first portion toward the plurality of first exhaust parts.

11. The deposition apparatus of claim 10, wherein the inner wall of the first portion comprises a first inner wall and a second inner wall defining any one of the plurality of flow paths, and an angle between the first inner wall and the second inner wall is greater than about 45 degrees and less than about 90 degrees.

12. The deposition apparatus of claim 1, wherein a portion of gas supplied from the gas supply to the reaction space flows into the lower space through the inner wall of the body part and the plate.

13. The deposition apparatus of claim 12, wherein an amount of the gas supplied from the gas supply to the reaction space and discharged to the plurality of first exhaust parts is greater than an amount of the portion of the gas flowing into the lower space through a space between the inner wall of the body part and the plate.

14. The deposition apparatus of claim 1, wherein the body part is capable of performing an Atomic Layer Deposition (ALD) process.

15. The deposition apparatus of claim 1, further comprising:

a second exhaust part provided on a bottom surface of the second portion.

16. A deposition apparatus comprising:

a gas supply comprising a plurality of gas injection ports;

a plate disposed to face the gas supply and to move up and down toward the gas supply, wherein a target substrate is seated on the plate;

a body part comprising:

a first portion defining a reaction space between the plate and the gas supply;

a second portion disposed below the first portion and defining a lower space; and an inner wall spaced apart from the plate;

a pumping line connected to an outer wall of the first portion; and a pump connected to the pumping line, wherein the inner wall defines a plurality of flow paths through which a gas supplied from the gas supply to the reaction space flows to a plurality of first exhaust parts, the inner wall comprises a first inner wall and a second inner wall defining any one of the plurality of flow paths, and an angle between the first inner wall and the second inner wall is greater than about 45 degrees and less than about 90 degrees.

17. The deposition apparatus of claim 16, further comprising:

a pressure gauge connected to the pumping line;

a throttle valve connected between the pressure gauge and the pump; and a controller capable of monitoring the pressure inside the body part using the pressure gauge and controlling movement of the throttle valve.

18. The deposition apparatus of claim 16, further comprising:

a third portion protruding from the outer wall of the first portion, wherein the pumping line is connected to the third portion.

19. The deposition apparatus of claim 18, wherein an inner wall of the third portion is formed to gradually decrease in width from the first portion toward the pumping line.

* * * * *